(12) United States Patent
Van Dijsseldonk et al.

(10) Patent No.: US 9,341,960 B2
(45) Date of Patent: May 17, 2016

(54) LITHOGRAPHIC APPARATUS AND DEVICE MANUFACTURING METHOD

(71) Applicant: ASML Netherlands B.V., Veldhoven (NL)

(72) Inventors: Antonius Johannes Josephus Van Dijsseldonk, Hapert (NL); Arno Jan Bleeker, Westerhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 224 days.

(21) Appl. No.: 14/356,124

(22) PCT Filed: Nov. 14, 2012

(86) PCT No.: PCT/EP2012/072559
§ 371 (c)(1),
(2) Date: May 2, 2014

(87) PCT Pub. No.: WO2013/083371
PCT Pub. Date: Jun. 13, 2013

(65) Prior Publication Data
US 2014/0285782 A1    Sep. 25, 2014

Related U.S. Application Data

(60) Provisional application No. 61/566,916, filed on Dec. 5, 2011.

(51) Int. Cl.
*G03B 27/52* (2006.01)
*G03F 7/20* (2006.01)
*G02B 27/12* (2006.01)

(52) U.S. Cl.
CPC .......... *G03F 7/70425* (2013.01); *G02B 27/126* (2013.01); *G03F 7/704* (2013.01); *G03F 7/70275* (2013.01); *G03F 7/70291* (2013.01); *G03F 7/70391* (2013.01)

(58) Field of Classification Search
CPC ............ G03F 7/70275; G03F 7/70291; G03F 7/70391; G03F 7/704; G03F 7/70425; G02B 27/126
USPC ........................................... 355/55
See application file for complete search history.

(56) References Cited

U.S. PATENT DOCUMENTS 4,090,206 A    5/1978 Pfeifer
4,447,126 A    5/1984 Heidrich
(Continued)

FOREIGN PATENT DOCUMENTS

DE    4315580    11/1994
DE    4315581    11/1994
(Continued)

OTHER PUBLICATIONS

LOT-Oriel Group Europe, "MicroWriter™ Laser Lithography System," www.LOT-Oriel.com (2 pp, date unknown, obtained Jul. 2010).
(Continued)

*Primary Examiner* — Peter B Kim
(74) *Attorney, Agent, or Firm* — Pillsbury Winthrop Shaw Pittman LLP

(57) ABSTRACT

An exposure apparatus having a projection system configured to project a plurality of radiation beams onto a target and an image slicer. The image slicer is arranged in an inverted configuration such that, if an input image formed of a plurality of separated image regions were provided to the image slicer, it would output an output image formed from the plurality of image regions, each arranged to adjoin an adjacent image region. The exposure apparatus is configured such that each of the radiation beams is input into the image slicer at a location corresponding to a respective one of the separated image regions.

20 Claims, 7 Drawing Sheets

(56) References Cited

U.S. PATENT DOCUMENTS

| | | |
|---|---|---|
| 4,520,472 A | 5/1985 | Reno |
| 4,525,729 A | 6/1985 | Agulnek |
| 4,640,573 A | 2/1987 | Kataoka |
| 4,780,730 A | 10/1988 | Dodge |
| 4,796,038 A | 1/1989 | Allen |
| 4,844,568 A | 7/1989 | Suzuki |
| 4,864,216 A | 9/1989 | Kalata |
| 4,952,949 A | 8/1990 | Uebbing |
| 5,051,762 A | 9/1991 | Lea |
| 5,216,247 A | 6/1993 | Wang |
| 5,216,534 A | 6/1993 | Boardman |
| 5,229,872 A | 7/1993 | Mumola |
| 5,296,891 A | 3/1994 | Vogt |
| 5,457,488 A | 10/1995 | Nakamura |
| 5,481,392 A | 1/1996 | Damer |
| 5,523,193 A | 6/1996 | Nelson |
| 5,568,320 A | 10/1996 | Rees |
| 5,589,973 A | 12/1996 | King |
| 5,610,754 A | 3/1997 | Gheen |
| 5,668,587 A | 9/1997 | Hammond |
| 5,705,788 A | 1/1998 | Beyer |
| 5,838,024 A | 11/1998 | Masuda |
| 5,840,451 A | 11/1998 | Moore |
| 6,037,965 A | 3/2000 | Gross |
| 6,133,986 A | 10/2000 | Johnson |
| 6,204,875 B1 | 3/2001 | De Loor |
| 6,268,613 B1 | 7/2001 | Cantu |
| 6,310,710 B1 | 10/2001 | Shahar |
| 6,313,862 B1 | 11/2001 | Berner |
| 6,377,599 B1 | 4/2002 | Marshall |
| 6,466,352 B1 | 10/2002 | Shahar |
| 6,531,681 B1 | 3/2003 | Markle |
| 6,559,438 B1 | 5/2003 | Drobot |
| 6,683,727 B1 | 1/2004 | Goring |
| 6,765,647 B1 | 7/2004 | Nishi |
| 6,795,169 B2 | 9/2004 | Tanaka |
| 6,967,711 B2 | 11/2005 | Gui |
| 7,116,402 B2 | 10/2006 | Gui |
| 7,969,636 B2 | 6/2011 | Naito |
| 2002/0115021 A1 | 8/2002 | Piao |
| 2002/0126479 A1 | 9/2002 | Zhai |
| 2002/0171047 A1 | 11/2002 | Chan |
| 2003/0043582 A1 | 3/2003 | Chan |
| 2003/0091277 A1 | 5/2003 | Mei |
| 2004/0124372 A1 | 7/2004 | Gil |
| 2004/0135159 A1 | 7/2004 | Siegel |
| 2004/0257629 A1 | 12/2004 | Noehte |
| 2005/0167508 A1 | 8/2005 | Syms |
| 2006/0001855 A1 | 1/2006 | Lof |
| 2006/0103719 A1 | 5/2006 | Katzir |
| 2006/0108508 A1 | 5/2006 | Khalid |
| 2007/0034890 A1 | 2/2007 | Daschner |
| 2007/0182808 A1 | 8/2007 | Stiblert |
| 2007/0296936 A1 | 12/2007 | Kato |
| 2008/0042969 A1 | 2/2008 | Baker |
| 2008/0047445 A1 | 2/2008 | Berner |
| 2008/0137051 A1 | 6/2008 | Maly |
| 2008/0160211 A1 | 7/2008 | Siegel |
| 2008/0210888 A1 | 9/2008 | Inoue |
| 2009/0296063 A1 | 12/2009 | Opower |
| 2010/0142757 A1 | 6/2010 | Sandstrom |
| 2010/0265557 A1 | 10/2010 | Sallander |
| 2011/0051211 A1 | 3/2011 | Walther |
| 2011/0188016 A1 | 8/2011 | De Jager |
| 2013/0107238 A1 | 5/2013 | Mulder |
| 2014/0071421 A1 | 3/2014 | De Jager et al. |

FOREIGN PATENT DOCUMENTS

| | | |
|---|---|---|
| DE | 19813127 | 10/1998 |
| EP | 1 835 347 | 9/2007 |
| JP | 57-152273 | 9/1982 |
| JP | S59-201026 | 11/1984 |
| JP | 06-275936 | 9/1994 |
| JP | H07-311302 | 11/1995 |
| JP | 2003-220484 | 8/2003 |
| JP | 2004-094141 | 3/2004 |
| JP | 2009-244446 | 10/2009 |
| JP | 2013-526046 | 6/2013 |
| WO | 94/15240 | 7/1994 |
| WO | 97/34171 | 9/1997 |
| WO | 98/33096 | 7/1998 |
| WO | 98/38597 | 9/1998 |
| WO | 2005/006082 | 1/2005 |
| WO | 2006/002668 | 1/2006 |
| WO | 2006/064363 | 6/2006 |
| WO | 2007/050022 | 5/2007 |
| WO | 2007/050023 | 5/2007 |
| WO | 2007/098935 | 9/2007 |
| WO | 2008/071347 | 6/2008 |
| WO | 2010/032224 | 3/2010 |
| WO | 2010/151123 | 12/2010 |
| WO | 2011/026610 | 3/2011 |
| WO | 2011/104176 | 9/2011 |
| WO | 2011/144387 | 11/2011 |

OTHER PUBLICATIONS

"Large-Plate Exposure System FX-63S," Nikon Web Magazine: Nikon Technology Outlook, Sep. 24, 2004, pp. 1-4.

JetScreen DX Flat Brochure (6 pp., date unknown, obtained Feb. 2009).

"Lithographic Apparatus and Device Manufacturing Method," Research Disclosure, Mason Publications, Hampshire, GB, vol. 551, No, 29, Mar. 1, 2010, p. 322, XP007139689, ISSN: 0374-4353.

International Search Report mailed Mar. 6, 2013 in corresponding International Patent Application No. PCT/EP2012/072559.

A. Kaufer, "A Two-Beam Two-Slice Image Slicer for Fiber-Linked Spectrogrphs," Fiber Optics in Astronomy III, ASP Conference Series, vol. 152, pp. 337-342 (1998).

R. P. Edwin, "Stripe stacker for use with laser diode bars," Optics Letters, vol. 20, No. 2, pp. 222-224 (Jan. 15, 1995).

Japanese Office Action dated Jul. 14, 2015 in corresponding Japanese Patent Application No. 2014-545151.

International Preliminary Report on Patentability mailed Jun. 19, 2014 in International Patent Application No. PCT/EP2012/072559.

LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2012/072559, which was filed on Nov. 14, 2012, which claims the benefit of priority of U.S. provisional application No. 61/566,916, which was filed on Dec. 5, 2011, and which is incorporated herein in its entirety by reference.

FIELD

The present invention relates to a lithographic or exposure apparatus and a method for manufacturing a device.

BACKGROUND

A lithographic apparatus is a machine that applies a desired pattern onto a substrate or part of a substrate. A lithographic apparatus may be used, for example, in the manufacture of integrated circuits (ICs), flat panel displays and other devices or structures having fine features. In a conventional lithographic apparatus, a patterning device, which may be referred to as a mask or a reticle, may be used to generate a circuit pattern corresponding to an individual layer of the IC, flat panel display, or other device). This pattern may transferred on (part of) the substrate (e.g. silicon wafer or a glass plate), e.g. via imaging onto a layer of radiation-sensitive material (resist) provided on the substrate. In a similar regard, an exposure apparatus is a machine that use a radiation beam in forming a desired pattern on or in a substrate (or a part thereof).

Instead of a circuit pattern, the patterning device may be used to generate other patterns, for example a color filter pattern, or a matrix of dots. Instead of a conventional mask, the patterning device may comprise a patterning array that comprises an array of individually controllable elements that generate the circuit or other applicable pattern. An advantage of such a "maskless" system compared to a conventional mask-based system is that the pattern can be provided and/or changed more quickly and for less cost.

Thus, a maskless system includes a programmable patterning device (e.g., a spatial light modulator, a contrast device, etc.). The programmable patterning device is programmed (e.g., electronically or optically) to form the desired patterned beam using the array of individually controllable elements. Types of programmable patterning devices include micro-mirror arrays, liquid crystal display (LCD) arrays, grating light valve arrays, arrays of self-emissive contrast devices and the like. A programmable patterning device could also be formed from an electro-optical deflector, configured for example to move spots of radiation projected onto the substrate or to intermittently direct a radiation beam away from the substrate, for example to a radiation beam absorber. In either such arrangement, the radiation beam may be continuous.

SUMMARY

In an apparatus such as that described above, a plurality of beams of radiation may be projected onto a target, such as a substrate, and each of the beams of radiation may be independently controlled in order to provide a desired pattern. It is desirable for the beams of radiation to be as close to each other as possible, for example in order to achieve a high resolution. Nevertheless, a certain amount of space is provided around each device used to form a respective radiation beam and/or control the radiation beam. Accordingly, it may be necessary to reduce the separation between adjacent radiation beams from an initial value that is constrained by the physical constraints of the system to a separation that is desirable for use.

This may be achieved using demagnification optics. However, the use of demagnification optics may not be desirable or may not be desirable for achieving all of the desired reduction in the separation between the radiation beams. This is because at the same time as reducing the separation of the radiation beams, such demagnification optics also reduces the cross-section of each of the radiation beams, which may be undesirable. Furthermore, the use of demagnification optics may have the effect of increasing an undesirable characteristic, such as the radiation beam pointing accuracy.

It is therefore desirable, for example, to provide a system to bring radiation beams closer together.

According to an embodiment of the invention, there is provided an exposure apparatus, comprising:

a projection system, configured to project a plurality of radiation beams onto a target; and an image slicer used in an inverted configuration such that, if an input image formed of a plurality of separated image regions were provided to the image slicer, it would output an output image formed from the plurality of image regions, each arranged to adjoin an adjacent image region, wherein the apparatus is configured such that each of the radiation beams is input into the image slicer at a location corresponding to a respective one of the separated image regions.

According to an embodiment of the invention, there is a provided device manufacturing method comprising:

using a projection system to project a plurality of radiation beams onto a target;

using an image slicer in an inverted configuration in order to adjust radiation beam paths of the radiation beams, the image slicer in the inverted configuration configured such that, if an input image formed of a plurality of separated image regions is provided to the image slicer, it outputs an output image formed from the plurality of image regions, each arranged to adjoin an adjacent image region; and inputting each of the radiation beams into the image slicer at a location corresponding to a respective one of the separated image regions.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

An embodiment of the present invention relates to an apparatus that may include a programmable patterning device that may, for example, be comprised of an array or arrays of self-emissive contrast devices. Further information regarding such an apparatus may be found in PCT patent application publication no. WO 2010/032224 A2, U.S. patent application publication no. US 2011-0188016, U.S. patent application No. 61/473,636 and U.S. patent application No. 61/524,190 which are hereby incorporated by reference in their entireties. An embodiment of the present invention, however, may be used with any form of programmable patterning device including, for example, those discussed above.

Figure 1:
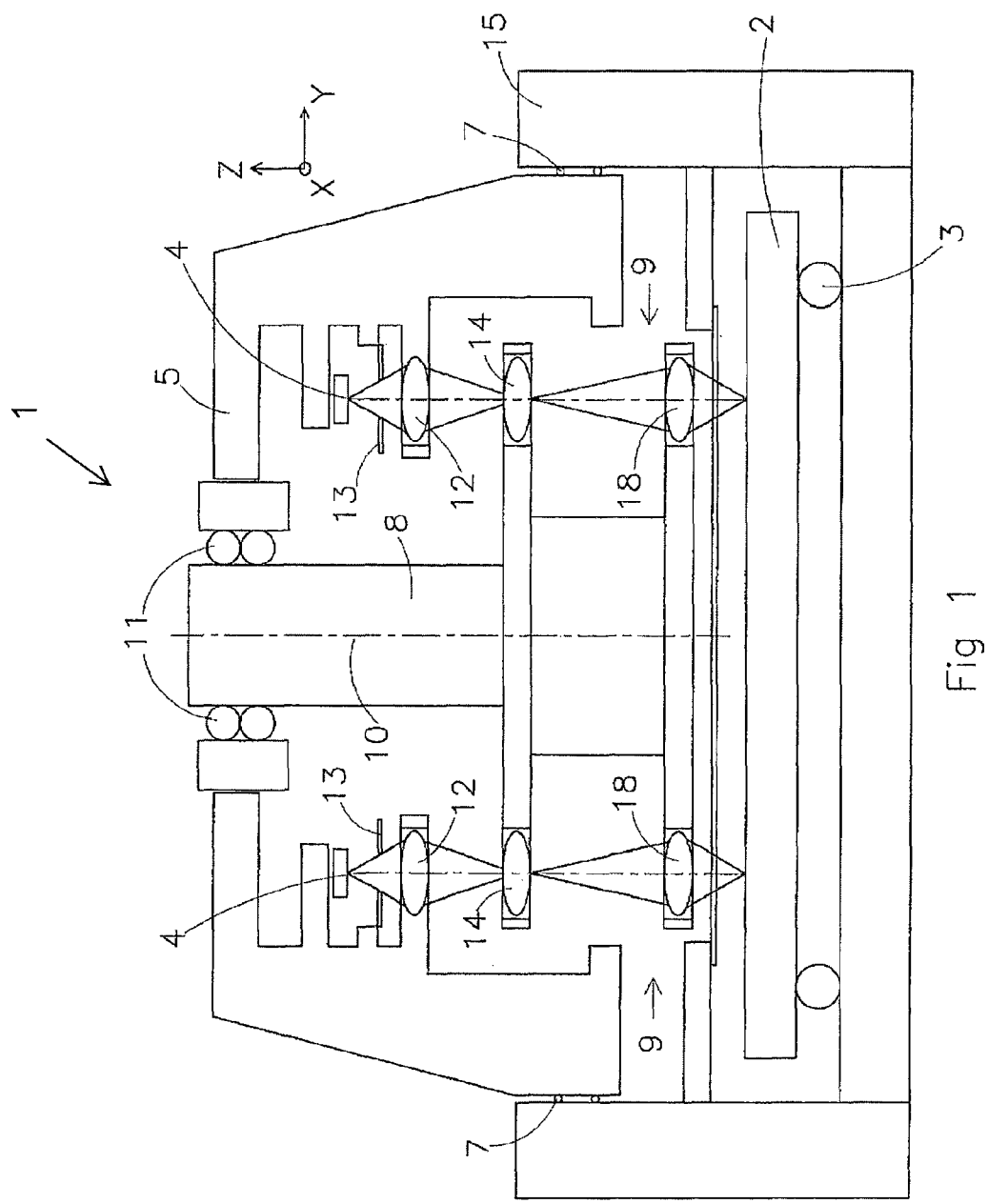
FIG. 1 depicts a part of a lithographic or exposure apparatus according to an embodiment of the invention.

FIG. 1 schematically depicts a schematic cross-sectional side view of a part of a lithographic or exposure apparatus. In this embodiment, the apparatus has individually controllable elements substantially stationary in the X-Y plane as discussed further below although it need not be the case. The apparatus 1 comprises a substrate table 2 to hold a substrate, and a positioning device 3 to move the substrate table 2 in up to 6 degrees of freedom. The substrate may be a resist-coated substrate. In an embodiment, the substrate is a wafer. In an embodiment, the substrate is a polygonal (e.g. rectangular) substrate. In an embodiment, the substrate is a glass plate. In an embodiment, the substrate is a plastic substrate. In an embodiment, the substrate is a foil. In an embodiment, the apparatus is suitable for roll-to-roll manufacturing.

The apparatus 1 further comprises a plurality of individually controllable self-emissive contrast devices 4 configured to emit a plurality of beams. In an embodiment, the self-emissive contrast device 4 is a radiation emitting diode, such as a light emitting diode (LED), an organic LED (OLED), a polymer LED (PLED), or a laser diode (e.g., a solid state laser diode). In an embodiment, each of the individually controllable elements 4 is a blue-violet laser diode (e.g., Sanyo model no. DL-3146-151). Such diodes may be supplied by companies such as Sanyo, Nichia, Osram, and Nitride. In an embodiment, the diode emits UV radiation, e.g., having a wavelength of about 365 nm or about 405 nm. In an embodiment, the diode can provide an output power selected from the range of 0.5-200 mW. In an embodiment, the size of laser diode (naked die) is selected from the range of 100-800 micrometers. In an embodiment, the laser diode has an emission area selected from the range of 0.5-5 micrometers$^2$. In an embodiment, the laser diode has a divergence angle selected from the range of 5-44 degrees. In an embodiment, the diodes have a configuration (e.g., emission area, divergence angle, output power, etc.) to provide a total brightness more than or equal to about $6.4 \times 10^8$ W/(m$^2 \cdot$sr).

Figure 2:
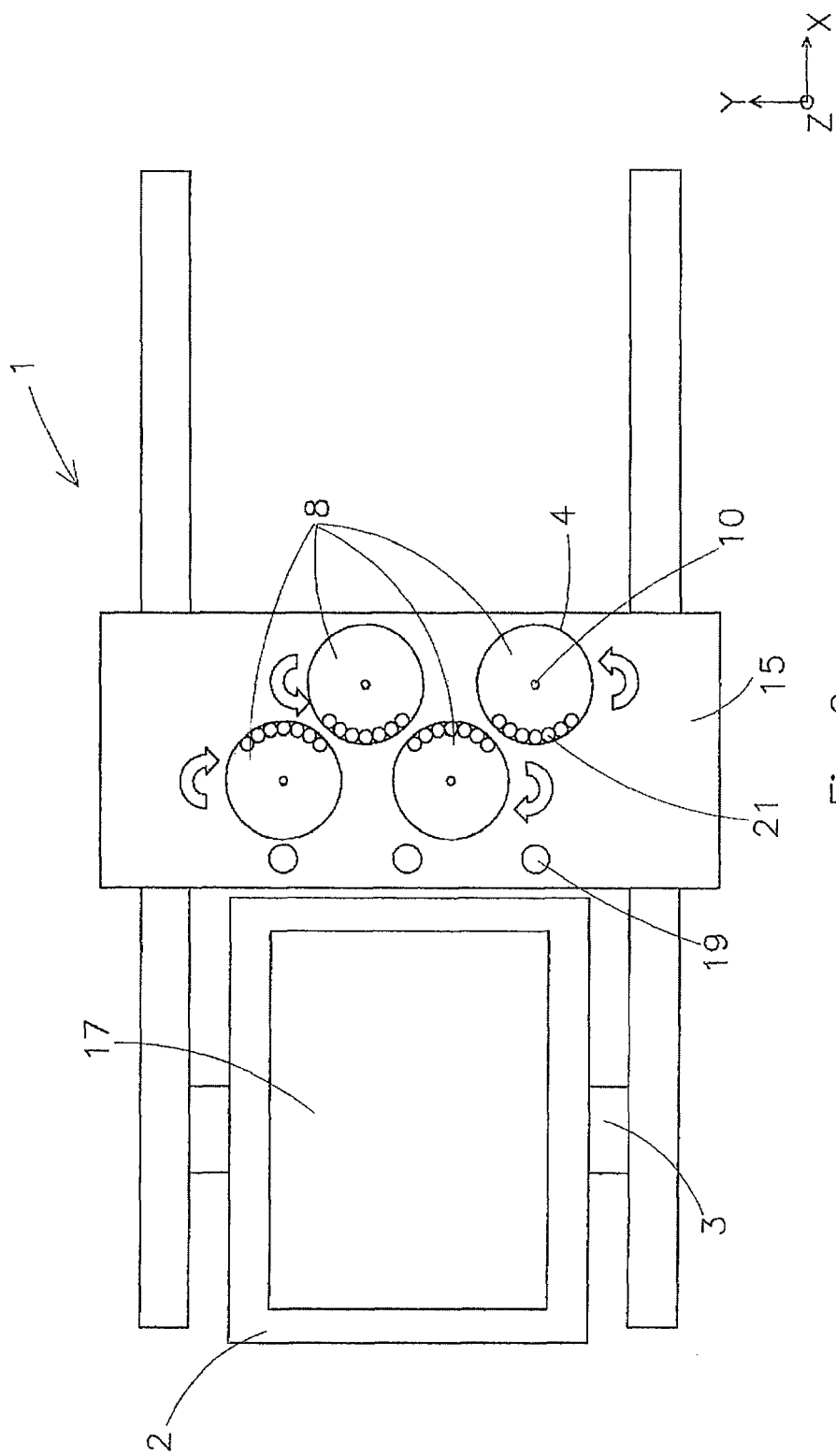
FIG. 2 depicts a top view of a part of the lithographic or exposure apparatus of FIG. 1 according to an embodiment of the invention.

The self-emissive contrast devices 4 are arranged on a frame 5 and may extend along the Y-direction and/or the X direction. While one frame 5 is shown, the apparatus may have a plurality of frames 5 as shown in FIG. 2. Further arranged on the frame 5 is lens 12. Frame 5 and thus self-emissive contrast device 4 and lens 12 are substantially stationary in the X-Y plane. Frame 5, self-emissive contrast device 4 and lens 12 may be moved in the Z-direction by actuator 7. Alternatively or additionally, lens 12 may be moved in the Z-direction by an actuator related to this particular lens. Optionally, each lens 12 may be provided with an actuator.

The self-emissive contrast device 4 may be configured to emit a beam and the projection system 12, 14 and 18 may be configured to project the beam onto a target portion of the substrate. The self-emissive contrast device 4 and the projection system form an optical column. The apparatus 1 may comprise an actuator (e.g. motor) 11 to move the optical column or a part thereof with respect to the substrate. Frame 8 with arranged thereon field lens 14 and imaging lens 18 may be rotatable with the actuator. A combination of field lens 14 and imaging lens 18 forms movable optics 9. In use, the frame 8 rotates about its own axis 10, for example, in the directions shown by the arrows in FIG. 2. The frame 8 is rotated about the axis 10 using an actuator (e.g. motor) 11. Further, the frame 8 may be moved in a Z direction by motor 7 so that the movable optics 9 may be displaced relative to the substrate table 2.

An aperture structure 13 having an aperture therein may be located above lens 12 between the lens 12 and the self-emissive contrast device 4. The aperture structure 13 can limit diffraction effects of the lens 12, the associated self-emissive contrast device 4, and/or of an adjacent lens 12/self-emissive contrast device 4.

The depicted apparatus may be used by rotating the frame 8 and simultaneously moving the substrate on the substrate table 2 underneath the optical column. The self-emissive contrast device 4 can emit a beam through the lenses 12, 14, and 18 when the lenses are substantially aligned with each other. By moving the lenses 14 and 18, the image of the beam on the substrate is scanned over a portion of the substrate. By simultaneously moving the substrate on the substrate table 2 underneath the optical column, the portion of the substrate which is subjected to an image of the self-emissive contrast device 4 is also moving. By switching the self-emissive contrast device 4 "on" and "off" (e.g., having no output or output below a threshold when it is "off" and having an output above a threshold when it is "on") at high speed under control of a controller, controlling the rotation of the optical column or part thereof, controlling the intensity of the self-emissive contrast device 4, and controlling the speed of the substrate, a desired pattern can be imaged in the resist layer on the substrate.

FIG. 2 depicts a schematic top view of the lithographic or exposure apparatus of FIG. 1 having self-emissive contrast devices 4. Like the apparatus 1 shown in FIG. 1, the apparatus 1 comprises a substrate table 2 to hold a substrate 17, a positioning device 3 to move the substrate table 2 in up to 6 degrees of freedom, an alignment/level sensor 19 to determine alignment between the self-emissive contrast device 4 and the substrate 17, and to determine whether the substrate 17 is at level with respect to the projection of the self-emissive contrast device 4. As depicted the substrate 17 has a rectangular shape, however also or alternatively round substrates may be processed.

The self-emissive contrast device 4 is arranged on a frame 15. The self-emissive contrast device 4 may be a radiation emitting diode, e.g., a laser diode, for instance a blue-violet laser diode. As shown in FIG. 2, the self-emissive contrast devices 4 may be arranged into an array 21 extending in the X-Y plane.

The array 21 may be an elongate line. In an embodiment, the array 21 may be a single dimensional array of self-emissive contrast devices 4. In an embodiment, the array 21 may be a two dimensional array of self-emissive contrast device 4.

A rotating frame 8 may be provided which may be rotating in a direction depicted by the arrow. The rotating frame may be provided with lenses 14, 18 (show in FIG. 1) to provide an image of each of the self-emissive contrast devices 4. The apparatus may be provided with an actuator to rotate the optical column comprising the frame 8 and the lenses 14, 18 with respect to the substrate.

Figure 3:
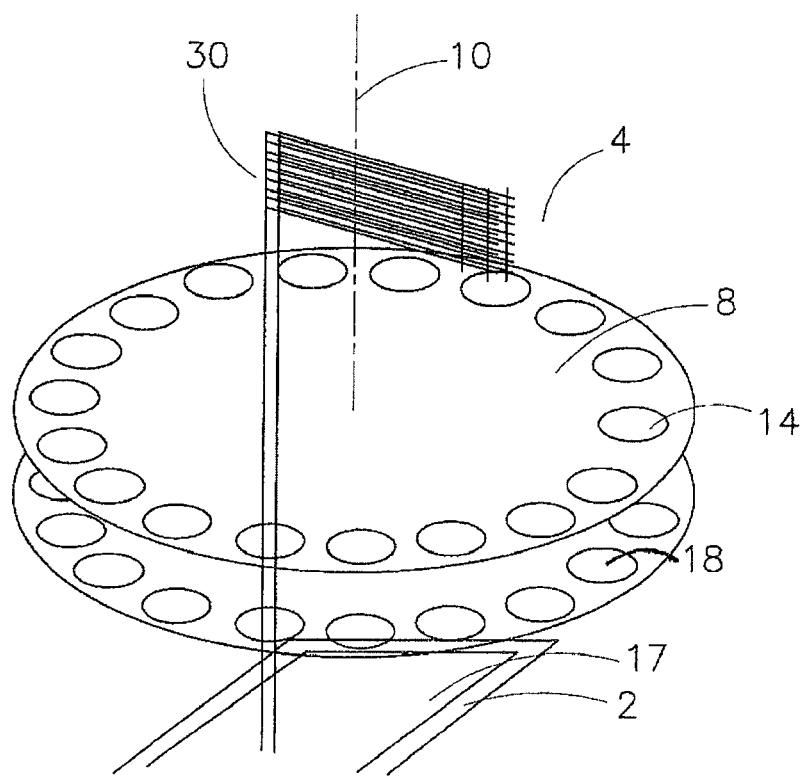
FIG. 3 depicts a highly schematic, perspective view of a part of a lithographic or exposure apparatus according to an embodiment of the invention.

FIG. 3 depicts a highly schematic, perspective view of the rotating frame 8 provided with lenses 14, 18 at its perimeter. A plurality of beams, in this example 10 beams, are incident onto one of the lenses and projected onto a target portion of the substrate 17 held by the substrate table 2. In an embodiment, the plurality of beams are arranged in a straight line. The rotatable frame is rotatable about axis 10 by means of an actuator (not shown). As a result of the rotation of the rotatable frame 8, the beams will be incident on successive lenses 14, 18 (field lens 14 and imaging lens 18) and will, incident on each successive lens, be deflected thereby so as to travel along a part of the surface of the substrate 17, as will be explained in more detail with reference to FIG. 4. In an embodiment, each beam is generated by a respective source, i.e. a self-emissive contrast device, e.g. a laser diode (not shown in FIG. 3). In the arrangement depicted in FIG. 3, the beams are deflected and brought together by a segmented mirror 30 in order to reduce a distance between the beams, to thereby enable a larger number of beams to be projected through the same lens and to achieve resolution requirements to be discussed below.

Figure 4:
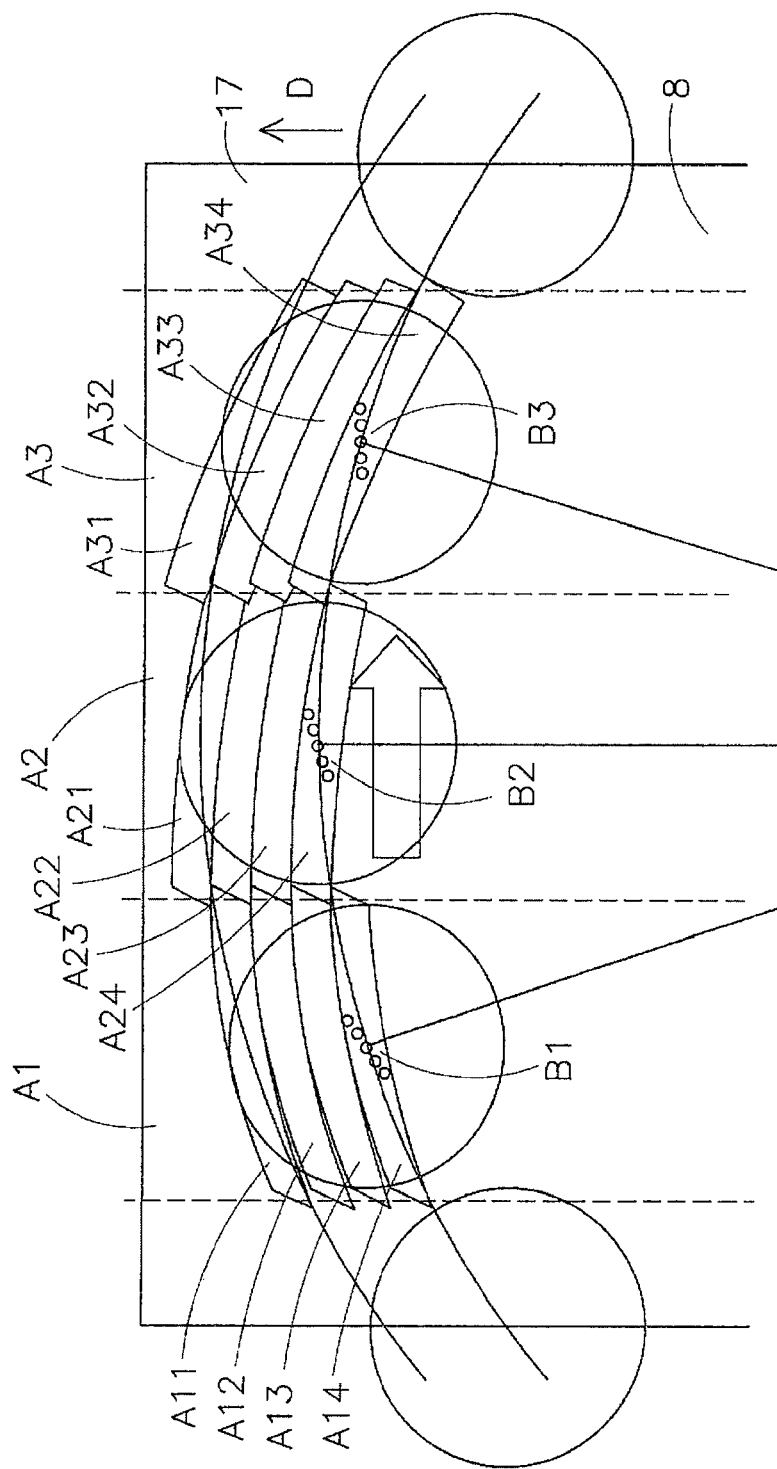
FIG. 4 depicts a schematic top view of projections by the lithographic or exposure apparatus according to FIG. 3 onto a substrate according to an embodiment of the invention.

As the rotatable frame rotates, the beams are incident on successive lenses and, each time a lens is irradiated by the beams, the places where the beam is incident on a surface of the lens, moves. Since the beams are projected on the substrate differently (with e.g. a different deflection) depending on the place of incidence of the beams on the lens, the beams (when reaching the substrate) will make a scanning movement with each passage of a following lens. This principle is further explained with reference to FIG. 4. FIG. 4 depicts a highly schematic top view of a part of the rotatable frame 8. A first set of beams is denoted by B1, a second set of beams is denoted by B2 and a third set of beams is denoted by B3. Each set of beams is projected through a respective lens set 14, 18 of the rotatable frame 8. As the rotatable frame 8 rotates, the beams B1 are projected onto the substrate 17 in a scanning movement, thereby scanning area A14. Similarly, beams B2 scan area A24 and beams B3 scan area A34. At the same time of the rotation of the rotatable frame 8 by a corresponding actuator, the substrate 17 and substrate table are moved in the direction D, which may be along the X axis as depicted in FIG. 2), thereby being substantially perpendicular to the scanning direction of the beams in the area's A14, A24, A34. As a result of the movement in direction D by a second actuator (e.g. a movement of the substrate table by a corresponding substrate table motor), successive scans of the beams when being projected by successive lenses of the rotatable frame 8, are projected so as to substantially abut each other, resulting in substantially abutting areas A11, A12, A13, A14 (areas A11, A12, A13 being previously scanned and A14 being currently scanned as shown in FIG. 4) for each successive scan of beams B1, areas A21, A22, A23 and A24 (areas A21, A22, A23 being previously scanned and A24 being currently scanned as shown in FIG. 4) for beams B2 and areas A31, A32, A33 and A34 (areas A31, A32, A33 being previously scanned and A34 being currently scanned as shown in FIG. 4) for beams B3. Thereby, the areas A1, A2 and A3 of the substrate surface may be covered with a movement of the substrate in the direction D while rotating the rotatable frame 8. The projecting of multiple beams through a same lens allows processing of a whole substrate in a shorter timeframe (at a same rotating speed of the rotatable frame 8), since for each passing of a lens, a plurality of beams scan the substrate with each lens, thereby allowing increased displacement in the direction D for successive scans. Viewed differently, for a given processing time, the rotating speed of the rotatable frame may be reduced when multiple beams are projected onto the substrate via a same lens, thereby possibly reducing effects such as deformation of the rotatable frame, wear, vibrations, turbulence, etc. due to high rotating speed. In an embodiment, the plurality of beams are arranged at an angle to the tangent of the rotation of the lenses 14, 18 as shown in FIG. 4. In an embodiment, the plurality of beams are arranged such that each beam overlaps or abuts a scanning path of an adjacent beam.

A further effect of the aspect that multiple beams are projected at a time by the same lens, may be found in relaxation of tolerances. Due to tolerances of the lenses (positioning, optical projection, etc), positions of successive areas A11, A12, A13, A14 (and/or of areas A21, A22, A23 and A24 and/or of areas A31, A32, A33 and A34) may show some degree of positioning inaccuracy in respect of each other. Therefore, some degree of overlap between successive areas A11, A12, A13, A14 may be required. In case of for example 10% of one beam as overlap, a processing speed would thereby be reduced by a same factor of 10% in case of a single beam at a time through a same lens. In a situation where there are 5 or more beams projected through a same lens at a time, the same overlap of 10% (similarly referring to one beam example above) would be provided for every 5 or more projected lines, hence reducing a total overlap by a factor of approximately 5 or more to 2% or less, thereby having a significantly lower effect on overall processing speed. Similarly, projecting at least 10 beams may reduce a total overlap by approximately a factor of 10. Thus, effects of tolerances on processing time of a substrate may be reduced by the feature that multiple beams are projected at a time by the same lens. In addition or alternatively, more overlap (hence a larger tolerance band) may be allowed, as the effects thereof on processing are low given that multiple beams are projected at a time by the same lens.

Alternatively or in addition to projecting multiple beams via a same lens at a time, interlacing techniques could be used, which however may require a comparably more stringent matching between the lenses. Thus, the at least two beams projected onto the substrate at a time via the same one of the lenses have a mutual spacing, and the apparatus may be arranged to operate the second actuator so as to move the substrate with respect to the optical column to have a following projection of the beam to be projected in the spacing.

In order to reduce a distance between successive beams in a group in the direction D (thereby e.g. achieving a higher resolution in the direction D), the beams may be arranged diagonally in respect of each other, in respect of the direction D. The spacing may be further reduced by providing a segmented mirror 30 in the optical path, each segment to reflect a respective one of the beams, the segments being arranged so as to reduce a spacing between the beams as reflected by the mirrors in respect of a spacing between the beams as incident on the mirrors. Such effect may also be achieved by a plurality of optical fibers, each of the beams being incident on a respective one of the fibers, the fibers being arranged so as to reduce along an optical path a spacing between the beams downstream of the optical fibers in respect of a spacing between the beams upstream of the optical fibers.

Further, such effect may be achieved using an integrated optical waveguide circuit having a plurality of inputs, each for receiving a respective one of the beams. The integrated optical waveguide circuit is arranged so as to reduce along an optical path a spacing between the beams downstream of the integrated optical waveguide circuit in respect of a spacing between the beams upstream of the integrated optical waveguide circuit.

A system may be provided for controlling the focus of an image projected onto a substrate. The arrangement may be provided to adjust the focus of the image projected by part or all of an optical column in an arrangement as discussed above.

In an embodiment the projection system projects the at least one radiation beam onto a substrate formed from a layer of material above the substrate 17 on which a device is to be formed so as to cause local deposition of droplets of the material (e.g. metal) by a laser induced material transfer. The substrate onto which the beam of radiation is projected may be referred to as a target.

Figure 5:
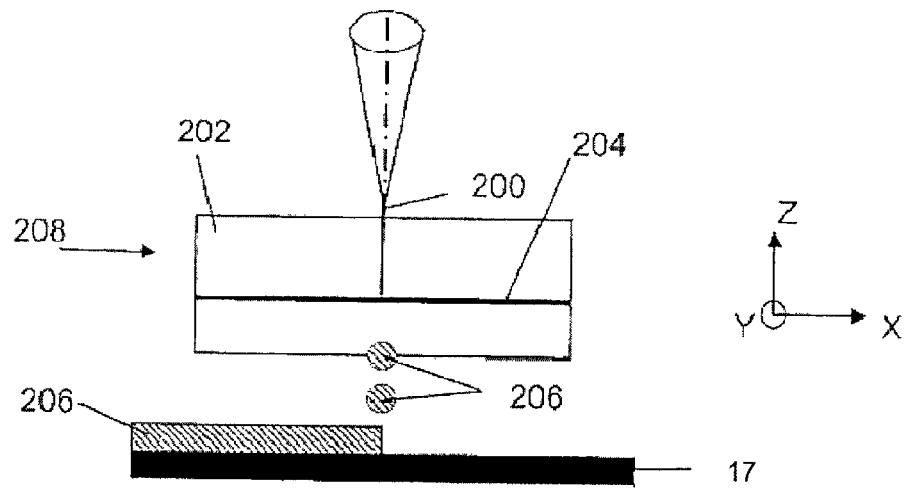
FIG. 5 depicts, in cross-section, a part of an embodiment of the invention.

Referring to FIG. 5, the physical mechanism of laser induced material transfer is depicted. In an embodiment, a radiation beam 200 is focused through a substantially transparent material 202 (e.g., glass) at an intensity below the plasma breakdown of the material 202. Surface heat absorption occurs on a substrate formed from a donor material layer 204 (e.g., a metal film) overlying the material 202. The heat absorption causes melting of the donor material 204. Further, the heating causes an induced pressure gradient in a forward direction leading to forward acceleration of a donor material droplet 206 from the donor material layer 204 and thus from the donor structure (e.g., plate) 208. Thus, the donor material droplet 206 is released from the donor material layer 204 and is moved (with or without the aid of gravity) toward and onto the substrate 17 on which a device is to be formed. By pointing the beam 200 on the appropriate position on the donor plate 208, a donor material pattern can be deposited on the substrate 17. In an embodiment, the beam is focused on the donor material layer 204.

In an embodiment, one or more short pulses are used to cause the transfer of the donor material. In an embodiment, the pulses may be a few picoseconds or femto-seconds long to obtain quasi one dimensional forward heat and mass transfer of molten material. Such short pulses facilitate little to no lateral heat flow in the material layer 204 and thus little or no thermal load on the donor structure 208. The short pulses enable rapid melting and forward acceleration of the material (e.g., vaporized material, such as metal, would lose its forward directionality leading to a splattering deposition). The short pulses enable heating of the material to just above the heating temperature but below the vaporization temperature. For example, for aluminum, a temperature of about 900 to 1000 degrees Celsius is desirable.

In an embodiment, through the use of a laser pulse, an amount of material (e.g., metal) is transferred from the donor structure 208 to the substrate 17 in the form of 100-1000 nm droplets. In an embodiment, the donor material comprises or consists essentially of a metal. In an embodiment, the metal is aluminum. In an embodiment, the material layer 204 is in the form a film. In an embodiment, the film is attached to another body or layer. As discussed above, the body or layer may be a glass.

An image slicer is a component configured such that an image input to the image slicer is divided into a plurality of image regions that are output from the image slicer separated from each other. Accordingly, the input image is divided into a plurality of discrete regions that are spaced apart. An embodiment of the present invention recognizes that such a component may be utilized in a lithographic or exposure apparatus.

In particular, in an embodiment, such an image slicer may be used in an inverted configuration, namely such that one could input a plurality of spaced apart image regions into the inverted image slicer and the output would be an image in which the image regions are rearranged such that they adjoin each other.

In this context, image regions, namely part of an image, are not input to the inverted image slicer. Instead, a radiation beam is input into the inverted image slicer at each location that corresponds to a respective one of the separated image regions of the conventional use of an image slicer. The output of the inverted image slicer is therefore the plurality of beams of radiation but the separation between the radiation beams at the output of the inverted image slicer is less than the separation of the radiation beams at the input of the inverted image slicer. Accordingly, the inverted image slicer is used to bring closer together the plurality of radiation beams. However, the radiation beams themselves may not be affected. In particular, although the radiation beams are brought closer together, the cross-section of each of the radiation beams may not be reduced.

In an embodiment, the inverted image slicer may comprise a Bowen-Walraven image slicer, or a derivative thereof, used in an inverted configuration, as discussed above. An arrangement of such an image slicer is depicted, in perspective, in FIG. 6 and, in cross-section, in FIG. 7. As shown, such an inverted image slicer 50 may be provided by a plate 51, an input prism 52 and an output prism 53.

All of the components of the inverted image slicer 50 are formed from a material that is transparent to the radiation beams used. For example, a glass commonly used to form a prism and/or other optical element may be used.

The plate 51 is configured to have first and second substantially parallel surfaces 51a, 51b. The plate 51 is arranged such that the surfaces 51a, 51b are at an oblique angle to the input radiation beams 55. Where one of the radiation beams transmits through the material of the plate 51 and is incident on a point of one of the internal surfaces 51a, 51b of the plate 51 that has an interface with a gas (e.g., air), which has a significantly different refractive index from the material of the plate, the radiation beam is internally reflected.

The input prism 52 is provided on a side of the plate 51, corresponding to the input radiation beams 55. The input prism 52 includes an input face 52a that is substantially perpendicular to the input radiation beams 55. Accordingly, the input radiation beams 55 are incident on the input face 52a of the input prism 52 and transmit through the input prism 52.

The input prism 52 further includes an interface face 52b. The interface face 52b is substantially parallel to the first surface 51a of the plate 51 and adjoins a part of the first surface 51a.

A first part of the first surface 51a of the plate 51 adjoins the input prism 52. A second part of the first surface 51 of the plate 51 does not adjoin the input prism 52 and therefore has an interface with gas. See FIG. 6. Accordingly, as discussed above, a beam of radiation may transmit through the plate 51 and be incident upon a point of the first surface 51a of the plate within the second part of the first surface 51a and be internally reflected.

Figure 6:
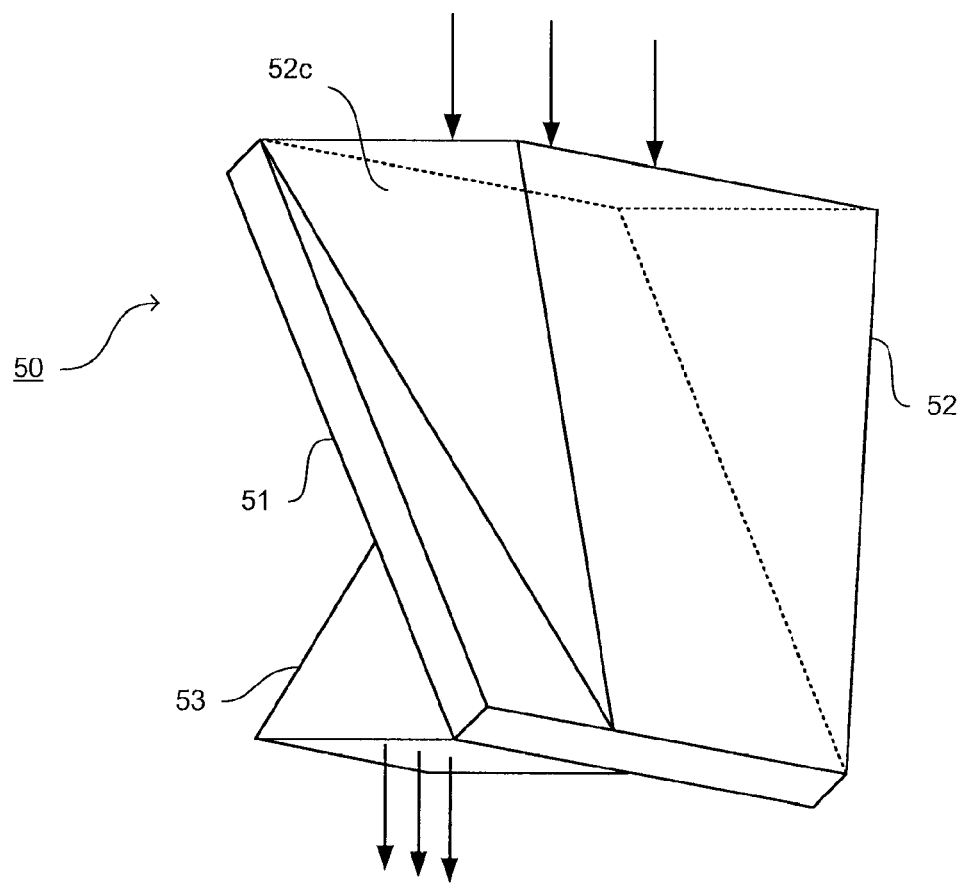
FIGS. 6 and 7 depict, in perspective and cross-section, respectively, an embodiment of the present invention.
Figure 7:
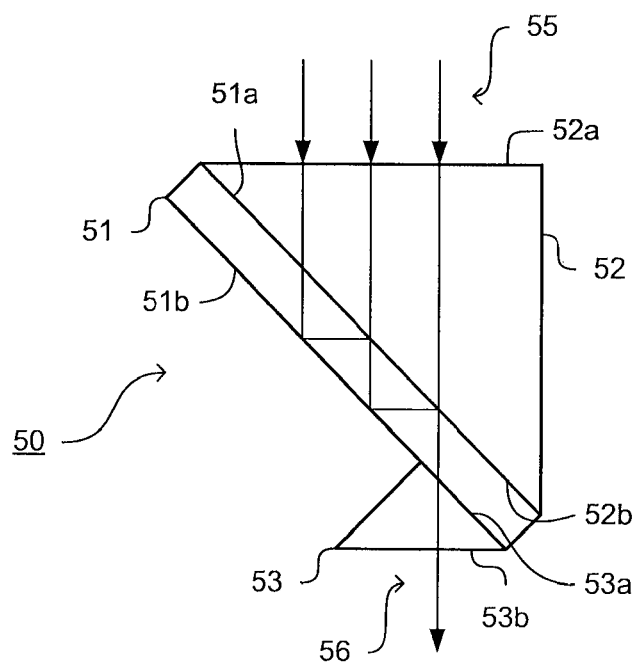

The input radiation beams 55 and the input prism 52 are carefully arranged, as depicted in for example FIG. 7, with reference to FIG. 6. In particular, each input radiation beam 55 is initially transmitted through the input prism 52 to a point at which the interface face 52b of the input prism 52 adjoins the first surface 51a of the plate. At that point, the radiation beam 55 is transmitted through the plate. Subsequently, the radiation beam is incident on a point on the second surface 51*b* of the plate 51 that has an interface with gas, at which it is internally reflected within the plate 51. The arrangement of each of the input radiation beams 55 and the shape of the input prism 52 is such that the radiation beam is thereafter repeatedly internally reflected within the plate 51 and at no point is again incident on a point at which the first surface 51*a* of the plate 51 adjoins the interface face 52*b* of the input prism 52. For example, as depicted in FIG. 6, the input prism 52 may have an inclined face 52*c*, ensuring that the interface face 52*b* adjoins the first surface 51*a* of the plate 51 at the desired locations.

The output prism 53 is arranged on the side of the plate 51 corresponding to the second surface 51*b*. The output prism 53 includes an interface face 53*a* and an output face 53*b*. The interface face 53*a* of the output prism 53 is arranged to be substantially parallel to and adjoin a part of the second surface 51*b* of the plate 51. The output prism 53 is arranged such that, after a number of internal reflections, which may be different for each radiation beam, the radiation beams are incident on a point at which the second surface 51*b* of the plate 51 adjoins the interface face 53*a* of the output prism 53. At that point, the radiation beam is transmitted through the output prism 53.

In an embodiment, as depicted in FIGS. 6 and 7, the output face 53*b* of the output prism 53 may be arranged to be substantially perpendicular to the direction of the output beams of radiation 56. Accordingly, when the radiation beams are incident on the output face 53*b* they are transmitted from the output prism 53, namely out of the inverted image slicer 50.

Provided the first and second surfaces 51*a*, 51*b* of the plate 51 are substantially parallel and the input face 52*a* of the input prism 52 and the output face 53*b* of the output prism 53 are substantially parallel to each other and substantially perpendicular to the input radiation beams 55, the output radiation beams 56 will be substantially perpendicular to the output face 53*b* of the output prism 53 and therefore substantially parallel to the input radiation beams 55. Accordingly, by appropriate control of the formation of the input prism 52, the plate 51 and the output prism 53, it may be possible to avoid introducing new radiation beam pointing errors. Furthermore, although the radiation beams are brought closer together, the cross-section of each of the radiation beams is substantially not affected.

As shown in FIG. 7, the input radiation beams 55 may be separated from each other in a direction within the plane of the image of FIG. 7, namely horizontally in the plane of FIG. 7. At the output of the inverted image slicer, the output radiation beams 56 may, as shown in FIG. 7, have no separation in this direction at all. However, in such an arrangement, the input radiation beams 55 are also separated from each other in a direction substantially perpendicular to the plane of the image and this separation is maintained through to the output radiation beams 56. The overall effect is to reduce the overall separation of the output radiation beams 56 such that it is less than the overall separation of the input radiation beams 55.

The reduction in the separation of the radiation beams is primarily controlled by the thickness of the plate 51, namely the separation of the first and second surfaces, 51*a*, 51*b*. The greater the thickness of the plate 51, the greater the reduction in the separation of the radiation beams. The minimum separation of the input radiation beams 55 is a function of the wedge angle of the interface face 52*b*, namely its angle relative to the input face 52*a* of the input prism 52.

Alternative or additional arrangements of image slicers may be used in an inverted configuration in place of that described above with reference to FIGS. 6 and 7.

Figure 8:
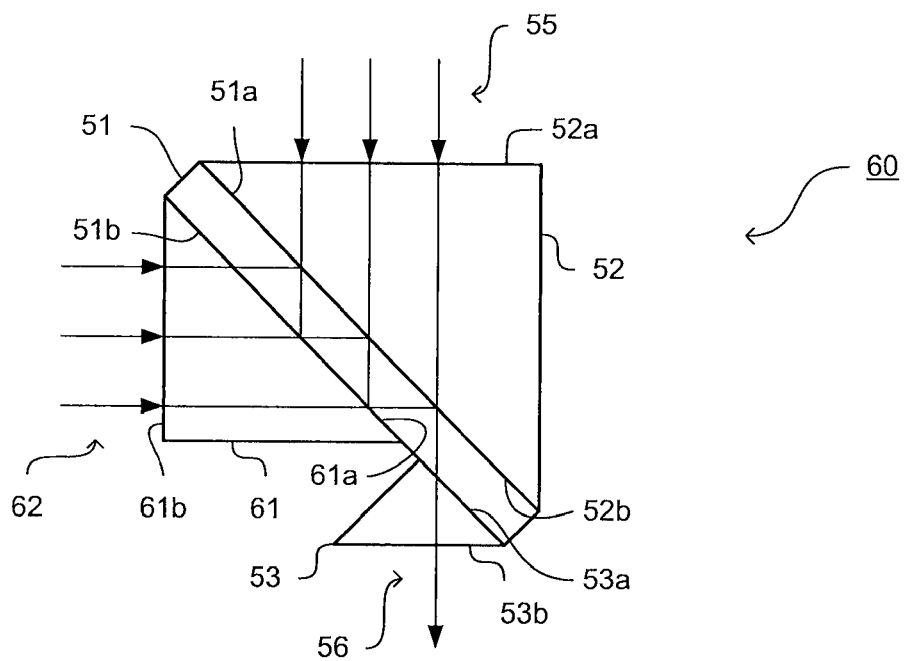
FIG. 8 depicts an embodiment of the invention that is a variation of the embodiment depicted in FIGS. 6 and 7.

FIG. 8 depicts a variation of the arrangement depicted in FIGS. 6 and 7. In this arrangement, the inverted image slicer 60 has, in addition to the input prism 52 and output prism 53 of the arrangement depicted in FIGS. 6 and 7, a second input prism 61. This is configured to enable a second group of radiation beams 62 to be input into the inverted image slicer 60 and output as part of the output beams of radiation 56.

As shown in FIG. 8, the second input prism 61, having an input face 61*b* and interface face 61*a*, may be arranged to function in a similar manner to the first input prism 52. However, it is provided to the second surface 51*b* rather than the first surface 51*a* of the plate 51. The arrangement of the first and second input prisms 52, 61 are arranged such that the radiation beams derived from the first group of input radiation beams 55 are not incident on a point of the second surface 51*b* of the plate 51 that adjoins the interface face 61*a* of the second input prism 61 in order that the each radiation beam is internally reflected within the plate 51. Likewise, the radiation beams derived from the second group of input radiation beams 62 are not incident on a point on the first surface 51*a* of the plate 51 at which it adjoins the interface face 52*b* of the first input prism 52 in order to ensure that it is internally reflected within the plate 51.

This may be achieved, for example, by configuring the second input prism 61 to have an inclined face corresponding to the inclined face 52*c* of the first input prism, in which the inclined faces are substantially parallel but offset in a direction substantially parallel to the surfaces 51*a*, 51*b* of the plate 51.

In such an arrangement, the first and second groups of radiation beams 55, 62 are plane polarized and oriented in mutually orthogonal directions. Furthermore, the first and second surfaces 51*a*, 51*b* of the plate 51 are appropriately polarization selective in order to transmit the input radiation beams 55, 62 into the plate 51. Coating arrangements such as those used in polarizing beam splitters may be used to achieve the appropriate polarization selectivity.

As shown in FIG. 8, the second input prism 61 and the second group of input radiation beams 62 may be arranged such that all of the output radiation beams 56, namely both the radiation beams derived from the first group of input radiation beams 55 and the radiation beams derived from the second group of input radiation beams 62 are aligned. However, each of the output radiation beams 56 may still be separated from each other, for example in the arrangement depicted in FIG. 8 in a direction substantially perpendicular to FIG. 8.

In a variation of such an arrangement, some or all of the radiation beams 62 of the second group may be arranged to be input into the plate 51 such that they are transmitted through the plate 51 coaxially with the respective internally reflected radiation beam derived from one of the first group of radiation beams 55. Thereafter, the radiation beams follow the same radiation beam path such that a radiation beam 62 from the second group of input radiation beams 62 may be superimposed on a radiation beam 55 from the first group of input radiation beams 55 in the output radiation beams 56.

As explained above, in the arrangement such as depicted in FIGS. 6 and 7 and/or depicted in FIG. 8, the input prisms 52, 61 are arranged such that, at some points on the first and second surfaces 51*a*, 51*b* of the plate 51, the prisms 52, 61 adjoin the respective surface, 51*a*, 51*b* of the plate to which they are mounted. At the same time, at other points, they are arranged not to adjoin such that there is a plate/gas interface in order to provide internal reflection.

Figure 9:
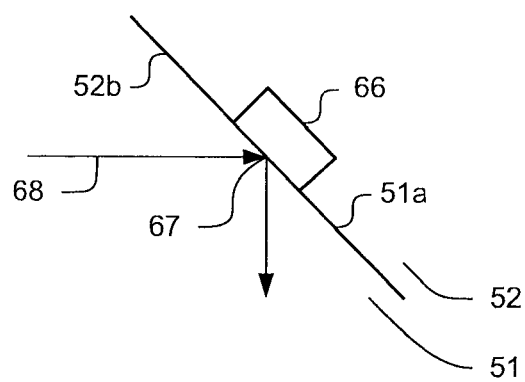
FIG. 9 depicts, in cross-section, a detail of an optional feature that may be used with any of the embodiments.

The location of these points is fixed for a particular configuration of input radiation beams 55,62. Accordingly, in an embodiment the input prisms 52,61 each have an interface face 52*b*, 61*a* that extends across the relevant part of the associated surface 51*a*, 51*b* of the plate 51 but has openings formed in the surface at each point at which an internal reflection is required. An example of this is depicted in FIG. 9, in which an opening 66 is provided within the interface face 52b of the input prism 52 adjacent a point 67 on the first surface 51a of the plate 51 at which it is desired for a radiation beam 68 to internally reflect within the plate 51.

In an arrangement, a respective opening 66 may be provided within the relevant input prism 52, 61 at each point at which an internal reflection is desired. Alternatively, one or more points at which an internal reflection is desired may coincide with a single opening, which may be formed as an appropriately oriented groove, within the relevant interface face 52b, 61a of the input prism 52, 61. Alternatively or additionally, the input prism 52, 61 may be formed such that the interface face 52b, 61a is formed from a plurality of protrusions, namely such that material is only provided at the points at which it is desired to input a radiation beam into the plate 51. Alternatively or additionally, the input prism 52, 61 may be divided into a plurality of discrete input prisms, each having a respective input face and interface face and each configured to input a single radiation beam into the plate 51 or input only some of the input radiation beams 55, 62 of the respective group.

The inverted image slicer of an embodiment of the present invention may be arranged in any of a number of different locations within the apparatus. In an embodiment having a projection system with at least a stationary part and a moving part, the inverted image slicer may be mounted to the stationary part. In an embodiment, the inverted image slicer may be arranged to be the first optical element within the projection system, or one of the first few elements within the projection system. By arranging the inverted image slicer in this way, the construction of the subsequent optical elements within the projection system may benefit from the separation between the plurality of radiation beams having been reduced.

Although an embodiment of the invention has been described above with reference to embodiments in which the inverted image slicer is a part of the projection system, this is merely an exemplary arrangement and the inverted image slicer may be provided at other locations within the apparatus. In an embodiment, the inverted image slicer may be provided between a plurality of radiation sources, configured to provide a plurality of radiation beams, and the one or more patterning devices configured to impart a pattern to the plurality of radiation beams.

In accordance with a device manufacturing method, a device, such as a display, integrated circuit or any other item may be manufactured from the substrate on which the pattern has been projected.

Although specific reference may be made in this text to the use of a lithographic or exposure apparatus in the manufacture of ICs, it should be understood that the lithographic or exposure apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine-readable instruction may be embodied in two or more computer programs. The two or more computer programs may be stored on one or more different memories and/or data storage media.

The term "lens", where the context allows, may refer to any one of various types of optical components, including refractive, diffractive, reflective, magnetic, electromagnetic and electrostatic optical components or combinations thereof.

The descriptions above are intended to be illustrative, not limiting. Thus, it will be apparent to one skilled in the art that modifications may be made to the invention as described without departing from the scope of the claims set out below.

The invention claimed is:

1. An exposure apparatus, comprising:
a projection system, configured to project a plurality of radiation beams onto a target; and
an image slicer used in an inverted configuration such that, if an input image formed of a plurality of separated image regions were provided to the image slicer, it would output an output image formed from the plurality of image regions, each arranged to adjoin an adjacent image region, wherein the apparatus is configured such that each of the radiation beams is input into the image slicer at a location corresponding to a respective one of the separated image regions.

2. The apparatus according to claim 1, wherein the image slicer is a Bowen-Walraven image slicer, or a derivative thereof.

3. The apparatus according to claim 1, wherein the image slicer comprises:
a plate of material that is transmissive to the radiation beams and has first and second substantially parallel surfaces that are at an oblique angle to the radiation beams input to the image slicer; and
an input prism having an input face that is substantially perpendicular to the radiation beams input to the image slicer and an interface face that is substantially parallel to and adjoins a part of the first surface of the plate,
wherein the image slicer is configured such that the input radiation beams propagate through the input prism to a point at which the input prism adjoins the plate, whereupon the radiation beams propagate through the plate, internally reflecting from the first and second surfaces and not incident on any further points at which the input prism adjoins the plate.

4. The apparatus according to claim 3, wherein the image slicer further comprises an output prism having an interface face that is substantially parallel to and adjoins a part of the second surface of the plate,
wherein the image slicer is configured such that, after a respective number of internal reflections within the plate, each beam of radiation is incident on a point at which the output prism adjoins the plate, whereupon it propagates through the output prism and is output from the image slicer.

5. The apparatus according to claim 4, wherein:
the output prism has an output face that is substantially perpendicular to the radiation beams output from the image slicer; and
a separation between adjacent radiation beams output from the image slicer at the output face of the output prism is less than a separation between adjacent radiation beams input to the image slicer at the input face of the input prism.

6. The apparatus according to claim 3, wherein:
the image slicer comprises a second input prism and a second group of radiation beams is input to the image slicer through the second input prism;
the second input prism has an input face that is substantially perpendicular to the second group of input radiation beams and an interface face that is substantially parallel to and adjoins a part of the second surface of the plate; and
the image slicer is configured such that the second group of input radiation beams propagate through the second input prism to a point at which the second input prism adjoins the plate, whereupon it propagates through the plate, internally reflecting from the first and second surfaces and is not incident on any further points at which the second input prism adjoins the plate.

7. The apparatus according to claim 6, wherein the first and second input prisms are configured such that the radiation beams input via the first input prism are incident on no points at which the second input prism adjoins the plate and the radiation beams input via the second input prism are incident on no points at which the first input prism adjoins the plate.

8. The apparatus according to claim 6, wherein the image slicer further comprises an output prism having an interface face that is substantially parallel to and adjoins a part of the second surface of the plate,
wherein the image slicer is configured such that, after a respective number of internal reflections within the plate, each beam of radiation is incident on a point at which the output prism adjoins the plate, whereupon it propagates through the output prism and is output from the image slicer, and
wherein the radiation beams input via the first and second input prisms are output via the output prism.

9. The apparatus according to claim 6, wherein:
the radiation beams of the first and second groups are plane polarized in mutually orthogonal directions; and
the first and second surfaces of the plate are conditioned such that the plane polarized radiation of each of the radiation beams input to the plate via the associated surface of the plate is transmitted into the plate.

10. The apparatus according to claim 3, wherein the first input prism, the second input prism, or both, is configured such that the interface face comprises a plurality of recesses arranged at points at which a radiation beam is incident on the adjoining surface of the plate and an internal reflection is required.

11. The apparatus according to claim 3, wherein the first input prism, the second input prism, or both, is configured such that the interface face comprises a plurality of protrusions arranged at points at which a radiation beam is to be transmitted from the respective input prism into the plate.

12. The apparatus according to claim 1, wherein the image slicer is configured such that, if all of the input radiation beams are substantially parallel to each other, all of the output radiation beams are substantially parallel to each other.

13. The apparatus according to claim 1, further comprising a programmable patterning device, configured to provide the plurality of radiation beams.

14. The apparatus according to claim 13, wherein the programmable patterning device comprises a controllable element to selectively provide the beams of radiation.

15. A device manufacturing method comprising:
using a projection system to project a plurality of radiation beams onto a target;
using an image slicer in an inverted configuration in order to adjust radiation beam paths of the radiation beams, the image slicer in the inverted configuration configured such that, if an input image formed of a plurality of separated image regions is provided to the image slicer, it outputs an output image formed from the plurality of image regions, each arranged to adjoin an adjacent image region; and
inputting each of the radiation beams into the image slicer at a location corresponding to a respective one of the separated image regions.

16. The method according to claim 15, wherein the image slicer comprises:
a plate of material that is transmissive to the radiation beams and has first and second substantially parallel surfaces that are at an oblique angle to the radiation beams input to the image slicer, and
an input prism having an input face that is substantially perpendicular to the radiation beams input to the image slicer and an interface face that is substantially parallel to and adjoins a part of the first surface of the plate; and
further comprising propagating the input radiation beams through the input prism to a point at which the input prism adjoins the plate, whereupon the radiation beams propagate through the plate, internally reflecting from the first and second surfaces and not incident on any further points at which the input prism adjoins the plate.

17. The method according to claim 16, wherein the image slicer further comprises an output prism having an interface face that is substantially parallel to and adjoins a part of the second surface of the plate; and
further comprising providing, after a respective number of internal reflections within the plate, each beam of radiation incident on a point at which the output prism adjoins the plate, whereupon it propagates through the output prism and is output from the image slicer.

18. The method according to claim 16, wherein the image slicer comprises a second input prism having an input face that is substantially perpendicular to a second group of input radiation beams and an interface face that is substantially parallel to and adjoins a part of the second surface of the plate; and
further comprising inputting the second group of radiation beams to the image slicer through the second input prism, and
propagating the second group of input radiation beams through the second input prism to a point at which the second input prism adjoins the plate, whereupon it propagates through the plate, internally reflecting from the first and second surfaces and is not incident on any further points at which the second input prism adjoins the plate.

19. The method according to claim 15, wherein all of the input radiation beams are substantially parallel to each other and all of the output radiation beams are substantially parallel to each other.

20. The method according to claim 15, wherein the image slicer is a Bowen-Walraven image slicer, or a derivative thereof.

* * * * *